United States Patent
Tseng

[11] Patent Number: 5,807,775
[45] Date of Patent: Sep. 15, 1998

[54] METHOD FOR FORMING A DOUBLE WALLED CYLINDRICAL CAPACITOR FOR A DRAM

[75] Inventor: Horng-Huei Tseng, Hsinchu, Taiwan

[73] Assignee: Vanguard International Semiconductor Corporation, Hsin-Chu, Taiwan

[21] Appl. No.: 668,713

[22] Filed: Jun. 24, 1996

[51] Int. Cl.⁶ .............................................. H01L 21/8242
[52] U.S. Cl. ........................... 438/253; 438/254; 438/397
[58] Field of Search ...................................... 438/238, 239, 438/253, 254, 396, 397

[56] References Cited

U.S. PATENT DOCUMENTS

| | | | |
|---|---|---|---|
| 5,266,512 | 11/1993 | Kirsch | 437/47 |
| 5,274,258 | 12/1993 | Ahn | 257/308 |
| 5,389,568 | 2/1995 | Yun | 437/60 |
| 5,443,993 | 8/1995 | Park et al. | 437/60 |
| 5,476,806 | 12/1995 | Roh et al. | 437/52 |

Primary Examiner—Joni Chang
Attorney, Agent, or Firm—George O. Saile; Stephen B. Ackerman; William J. Stoffel

[57] ABSTRACT

A method for manufacturing a double walled cylindrical stacked capacitor for a DRAM using only one photo mask is provided. An insulating layer having a contact opening is formed over a transistor. A first conductive layer is then formed over the insulating layer. The first conductive layer is patterned forming a central spine over the contact opening and portions of the first conductive layer are left covering the insulation layer. Dielectric spacers are formed on the sidewall of the central spine. The remaining portions of the first conductive layer over the first insulating layer are removed and upper portions of the central spine are removed forming a conductive base. Inner and outer conductive walls are formed on the sidewalls of the dielectric spacers thereby forming a double walled bottom electrode. The dielectric spacers are removed. A capacitor dielectric layer and a top electrode are formed over the bottom electrode forming the capacitor. The invention uses sidewall spacers and selective etching techniques to forms a low cost, simple to manufacture, high capacitance capacitor and DRAM cell.

13 Claims, 5 Drawing Sheets

METHOD FOR FORMING A DOUBLE WALLED CYLINDRICAL CAPACITOR FOR A DRAM

Background of Invention

1) Field of the Invention

The present invention relates generally to the fabrication of capacitors and particularly to a method for fabricating a highly integrated semiconductor memory having a stacked capacitor and more particularly to a method for forming a double walled cylindrical stacked capacitor.

2) Description of the Prior Art

Capacitors have been an important and irreplaceable circuit element used often in semiconductor circuit designs. For example, capacitors are widely used in applications, such as dynamic random access memory (DRAM), active and passive filters, analog-to-digital and digital-to-analog converters (AID and D/A converters respectively), operational amplifiers, radio and tuning circuits, oscillators and multivibrator circuits, time critical and time delay circuitry, noise reduction circuitry, charge pumps, power electronics and many other diverse applications.

A capacitor is defined in the simplest terms as a device consisting of two conducting surfaces separated by an insulating material. A capacitor stores electrical energy or charge, blocks the flow of direct current (DC) and permits the flow of alternating current (AC) depending essentially upon the capacitance of the device and the frequency of the incoming current or charge. Capacitance, measured in farads, is determined by three physical characteristics: (1) thickness or average thickness of the insulating material separating the two conducting surfaces; (2) how much surface area is covered by the two conducting surfaces and (3) various mechanical and electrical properties of the insulting material and the two conducting plates or electrodes.

The development of the semiconductor industry has always followed that of the Dynamic Random Access Memory (DRAM) technology in that DRAM development has led in the use of the highest density technology elements capable of being produced in manufacturable quantities. Problems, such as alpha-particle soft errors and maintaining minimum signal-to-noise ratios, require capacitors for DRAMs to have a maximum capacitance per memory cell area. However, the memory cell area is reduced by at least 200% for each new generation. With this trend in memory cell miniaturization, maintaining a nearly unscaled capacitance value is a challenge that requires substantial engineering effort and inventive ingenuity. The development of DRAM's in the 4 Megabit density range began to depart from the twenty year tradition of two-dimensional DRAM designs by the appearance of three-dimensional DRAM cell structures. Proposed designs for DRAM cells in 16 MB, 64 MB and high density range have also included the use of multi-plate or stacked storage capacitor cell designs. Although the use of stacked cell technology has rendered the processing of DRAMs more complex such techniques continue to be used extensively.

The decrease in cell capacitance caused by reduced memory cell area is a serious obstacle to increasing packing density in dynamic random access memories (DRAMs). Thus, the problem of decreased cell capacitance must be solved to achieve higher packing density in semiconductor memory devices, since decreased cell capacitance degrades read-out capability and increases the soft error rate of the memory cell as well as consumes excessive power during low-voltage operation by impeding device operation.

Generally, in a 64 MB DRAM having a 1.5 $m^2$ memory cell area employing an ordinary two dimensional stacked capacitor cell, sufficient cell capacitance cannot be obtained even though a higher dielectric constant material, e.g., tantalum oxide ($Ta_2O_5$), is used. Therefore, stacked capacitors having a three-dimensional structure have been suggested to improve cell capacitance. Such stacked capacitors include, for example double-stacked, fin-structured, cylindrical, spread-stacked, and box structured capacitors.

Since both outer and inner electrode surfaces can be utilized as an effective capacitor area, the cylindrical structure is favorably suitable to the three-dimensional stacked capacitor, and is more particularly suitable for an integrated memory cell which is 64 Mb or higher. Also, an improved stacked capacitor has recently been presented, where pillars are formed in the interior of another cylinder. The outer surface of the pillars or the inner cylinder formed in the interior of the cylinder. However, even more surface area and capacitance are required to achieve higher densities.

The following U.S. patents show related processes and capacitor structures. U.S. Pat. No. 5,443,993 (Park) shows process to form a double cylindrical nested capacitor. U.S. Pat. No. 5,274,258 (Ahn) shows a capacitor having an outer wall and inner electrode comprised of pillars. U.S. Pat. No. 5,389,568 (Yun) teaches a method of forming a cylindrical capacitor with central pillar including a hole. U.S. Pat. No. 5,266,512 (Kirsh) teaches a process to form a triple walled nested capacitor. This method forms upright electrodes as spacers. However, these methods can be further improved upon. Although the capacitors mentioned above offer surface area saving, they are (1) limited by lithography; (2) in most cases lithographically intense; (3) not space efficient enough for future memory generations (4) result in topographical problems due to large vertical differences in height across the capacitive devices and (5) tend to be mechanically more unstable as topography increases and therefore less manufacturable (6) require substantially more processing steps or/and planar structures which make the manufacturing process more complex and costly, (7) some rely on etching to a predetermined etch depth which can be quite difficult to control in a manufacturing environment.

There is also a challenge to develop methods of manufacturing these capacitors that minimize the manufacturing costs and maximize the device yields. There is also a challenge to develop a method to produce a capacitor with a minimum leakage current, a larger capacitance, a higher reliability and which is easy to manufacture. Therefore, it is very desirable to develop processes that are as simple as possible and also have large process windows.

SUMMARY OF THE INVENTION

It is an object of the present invention to provide a method for fabricating a double walled cylindrical crown capacitor which has a large capacitance, ensures high reliability, and is easy to manufacture.

It is an object of the present invention to provide a method for fabricating a double walled cylindrical stacked capacitor which has a large cell capacitance.

It is an object of the present invention to provide a method DRAM having a double walled cylindrical capacitor.

To accomplish the above objectives, the present invention provides a method of manufacturing a double walled cylindrical stacked capacitor for a DRAM on a substrate having source regions, drain regions, and gate electrode structures.

The method begins by forming an insulating layer over the substrate surface. A contact opening is formed exposing the source region. A first conductive layer is then formed over the insulating layer and fills the contact opening forming an electrical contact with the source region. The first conductive layer is patterned forming a central spine over the contact opening, and portions of the first conductive layer are left covering the insulating layer. A first dielectric layer is formed over the remaining potions of the first conductive layer. The first dielectric layer is anisotropically etched forming dielectric spacers on the sidewall of the central spine, and the dielectric spacers having sidewalls. The remaining portions of the first conductive layer over the first insulating layer and upper portions of the central spine are anisotropically etched using the dielectric spacers as a mask thereby forming a conductive base. A second conductive layer is formed over the insulating layer, the conductive base, and the dielectric spacers. The second conductive layer is selectively etched forming inner and outer conductive walls on the sidewalls of the dielectric spacers. The dielectric spacers are then removed using a selective etch. A capacitor dielectric layer and a top electrode is formed over the double walled storage node and the insulating layer forming a double walled cylindrical capacitor.

The method of the current invention forms a double walled cylindrical shaped capacitor which has a high surface area and capacitance. The invention eliminates several expensive photo masks steps by using sidewall spacer and selective etch techniques. This reduces manufacturing costs and provides a simple process. The sidewall spacer techniques reduce the capacitor size and increase the capacitance.

BRIEF DESCRIPTION OF THE DRAWINGS

The features and advantages of a semiconductor device according to the present invention and further details of a process of fabricating such a semiconductor device in accordance with the present invention will be more clearly understood from the following description taken in conjunction with the accompanying drawings in which like reference numerals designate similar or corresponding elements, regions and portions and in which.

DETAILED DESCRIPTION OF THE PREFERRED EMBODIMENTS

Now in keeping with the objectives of this invention, the method for forming a DRAM cylindrical storage capacitor is described in detail. The general overall sequence of fabrication steps for the cylindrical capacitor and DRAM is shown in FIGS. 1 through 9. Also, the term "dimension" includes the length, width, or diameter of the object being described, whether the object is irregularly shaped or regularly shaped, such as a circle or rectangle. Also, in this specification, the term "about" when describing a number or a range, means plus or minus 10% of that number or range.

Figure 1:
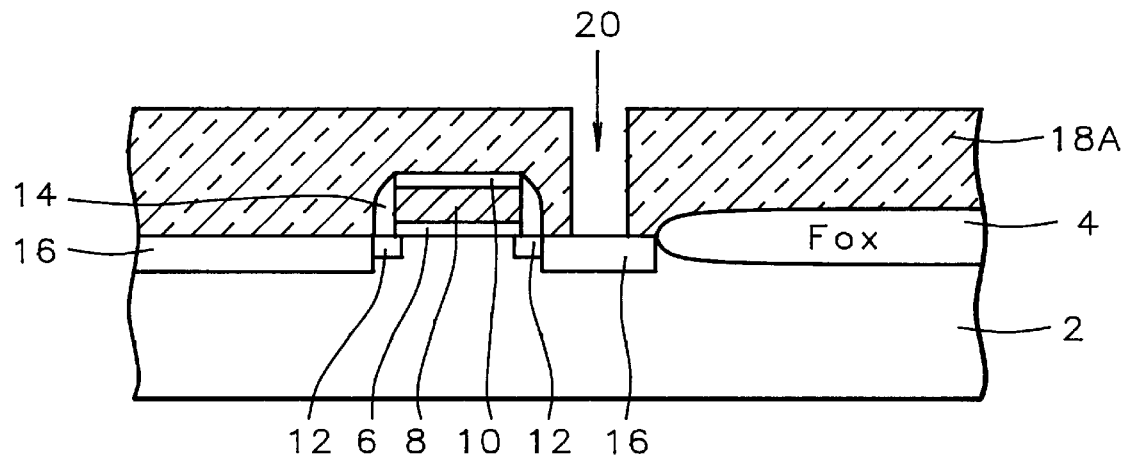
FIGS. 1 through 9 are cross sectional views for illustrating method for manufacturing the capacitor and DRAM cell according to the present invention.

Referring to FIG. 1, it is assumed that an unit semiconductor element, for example a MOSFET, which is partially completed is formed on the silicon substrate 2 upon which the capacitor according to the present invention will be formed. The substrate can have active areas including an array of memory cells, each of the memory cells having a MOSFET transistor. The capacitor is formed over a memory cell area in the substrate.

The transistor can comprise source regions, drain regions 16 and gate electrode structures (such as gate oxide 6, gate electrode 8, top gate insulating layer 10, and spacers 14) and other devices, such as a LDD regions (light doped source and drain), bit line, word lines, p and n wells, and field oxide regions 4. FIG. 1 shows representations, not detailed and not to scale, of various elements in one possible configuration. The devices can be formed using conventional fabrication techniques. The capacitor in a memory cell is formed over the related transistor components in a cell area on the substrate.

As shown in FIG. 1, an insulating layer (oxide) 18A is formed over the substrate surface including the source, drain and transfer gate structures 6 8 10 14 of the DRAM cell. The first insulating layer 18A is preferably composed of silicon nitride, silicon oxide, or a doped silicon oxide, such as phosphosilicate glass (PSG), or borophosphosilicate glass (BPSG). The first insulating layer 18A preferably has a thickness in the range between about 5000 and 10,000 Å. The first insulating layer can include several underlying layers, such as a silicon oxide layer. A first insulating layer composed of silicon oxide can be formed using a tetraethylorthosilicate oxide (TEOS) by depositing silicon oxide at 650° to 750° C. in a low pressure chemical vapor deposition reactor.

Next, a contact opening 20 (hole) is etched through the first insulating layer 18A and exposes an active region, such as a source region 16. The contact opening can be formed by a conventional photo patterning process.

Figure 2:
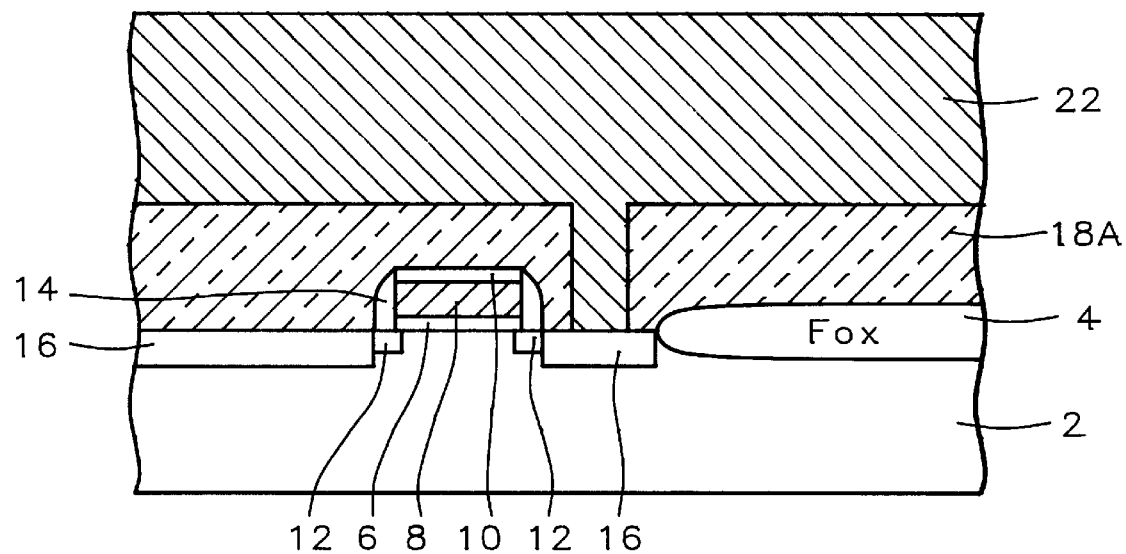

As shown in FIG. 2, a first conductive layer 22 (e.g., doped polysilicon) is formed over the insulating layer 18A and fills the contact opening 20 (node contact) forming an electrical contact with the source region 16. The first conductive layer 22 fills the contact hole 20 and makes an electrical connection to the source region 16 on the substrate surface. The first conductive layer 22 is preferably formed of polysilicon. The first conductive layer preferably has a thickness in the range of between about 1000 and 2000 Å. The first conductive layer is preferably doped by an insitu process or by an ion implant process using arsenic ions. The first conductive layer preferably has an impurity concentration in the range of between about 1E19 and 1E21 atoms/$cm^3$. A polysilicon layer can be deposited by prolysing silane in a low pressure chemical vapor deposition process at about 620° C.

Figure 3:
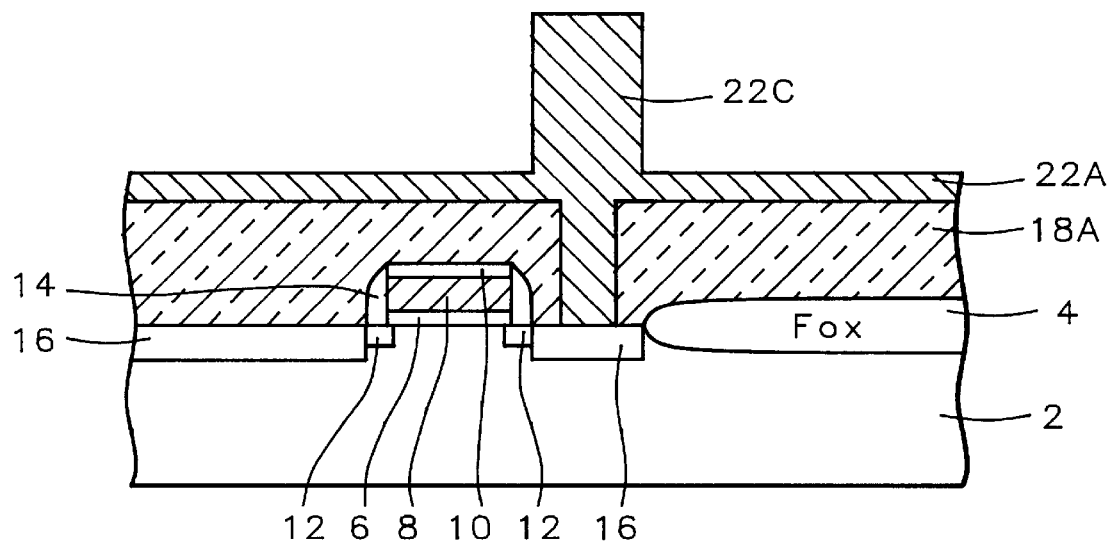

As shown in FIG. 3, the first conductive layer 22 is patterned forming a central spine (22C) over the contact opening 20, and leaving portions of the first conductive layer 22A covering the insulation layer 18A. The central spine 22C has sidewalls. The first conductive layer 22 can be patterned using convention photolithography processes. The central spine preferably has a rectangular, (Box) or cylindrical shape, but can have any desired shape.

Figure 4:
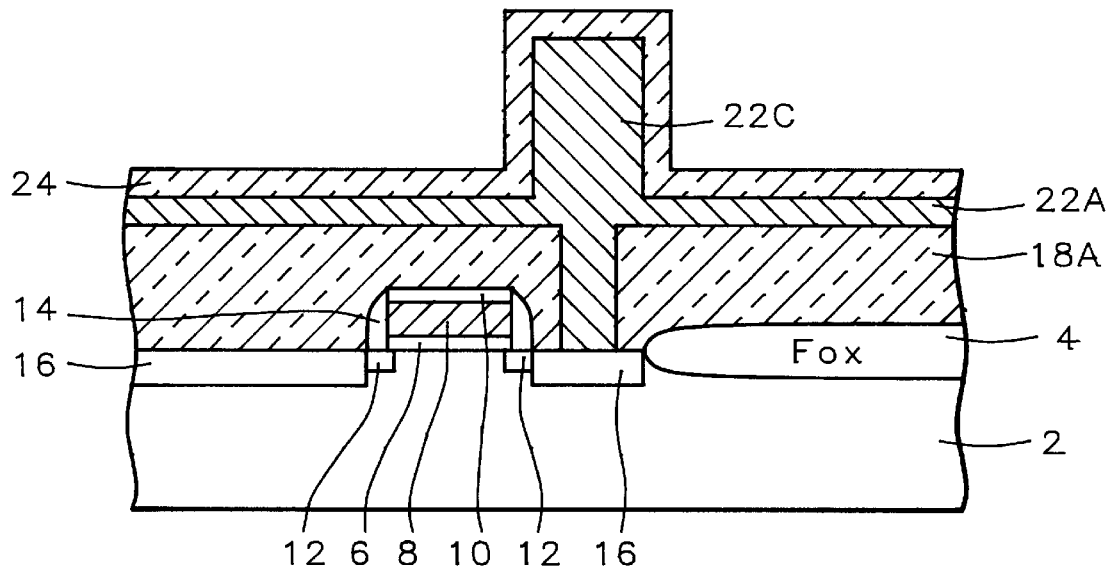

As shown in FIG. 4, a first dielectric (nitride) layer 24 is formed over the remaining portions of the first conductive layer 22A and the central spine 22C. The first dielectric layer 24 is preferably formed of silicon nitride (SiN). The first dielectric layer composed of nitride can be made with an atmospheric or LPCVD process. The silicon nitride layer can be formed by reacting silane and ammonia at atmospheric pressure at 700° to 900° C., or by reacting dichlorosilane and ammonia at reduced pressure at approximately 700° C. The first dielectric layer preferably has a thickness in the range of between about 500 and 2000 Å. The anisotropic etch is preferably a chloride containing reactive ion etch (RIE), such as $CHF_3$.

Figure 5:
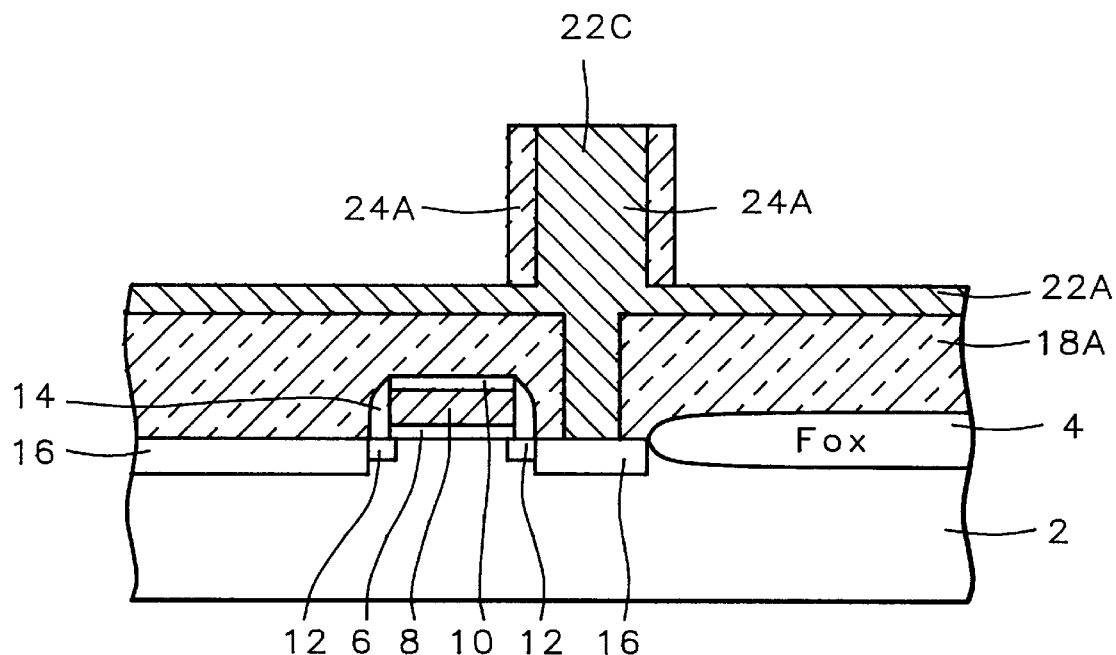

As shown in FIG. 5, the first dielectric (nitride) layer 24A is anisotropically etched thereby forming dielectric (nitride) spacers 24A on the sidewall of the central spine 22C. The dielectric (nitride) spacers 24A have sidewalls.

Figure 6:
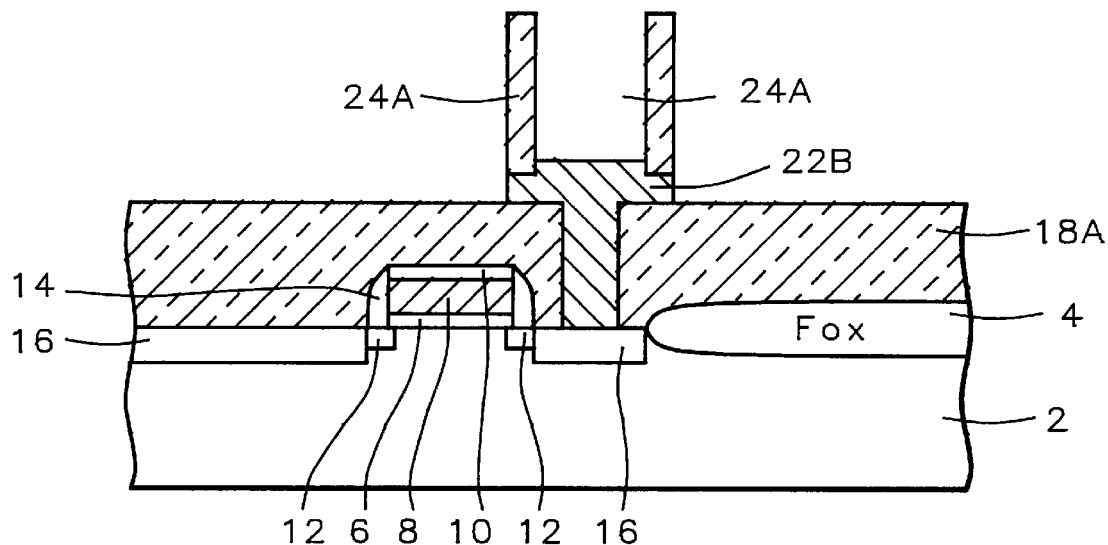

As shown is FIG. 6, the remaining portions of the first conductive layer 22A over the first insulating layer 18A and upper portions of the central spine are anisotropically etched using the dielectric (nitride) spacers 24A as a mask thereby forming a conductive base 22B. The anisotropic etch is preferably a RIE etch using $Cl_2$ and HBr. This anisotropic etch can be accomplished by reactive ion etching with $Cl_2$ at 420 sccm, HBr at 80 sccm, and He at 180 sccm, and He at 180 sccm, at a pressure of about 300 mtorr, and a power of about 450 watts. A Rainbow 4420, manufactured by Lam Research Company, may be used for this etch.

Figure 7:
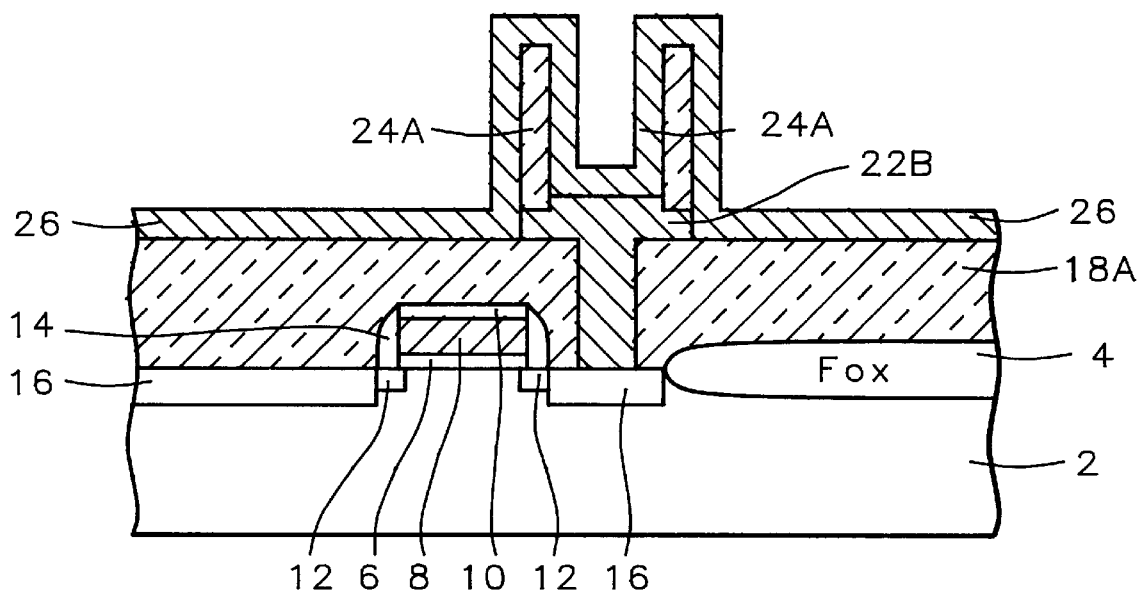

As shown in FIG. 7, a second conductive layer 26 is formed over the insulating layer 18A, the conductive base 22B, and the dielectric (nitride) spacers 24A. The second conductive layer 26 is preferably formed of polysilicon or doped polysilicon. The second conductive layer preferably has a thickness in the range of between about 500 and 2000 Å. The second conductive layer composed of polysilicon is preferably doped by an insitu process or by an ion implant process using arsenic ions. The second conductive layer preferably has an impurity concentration in the range of between about 1E19 and 1E21 atoms/$cm^3$.

Figure 8:
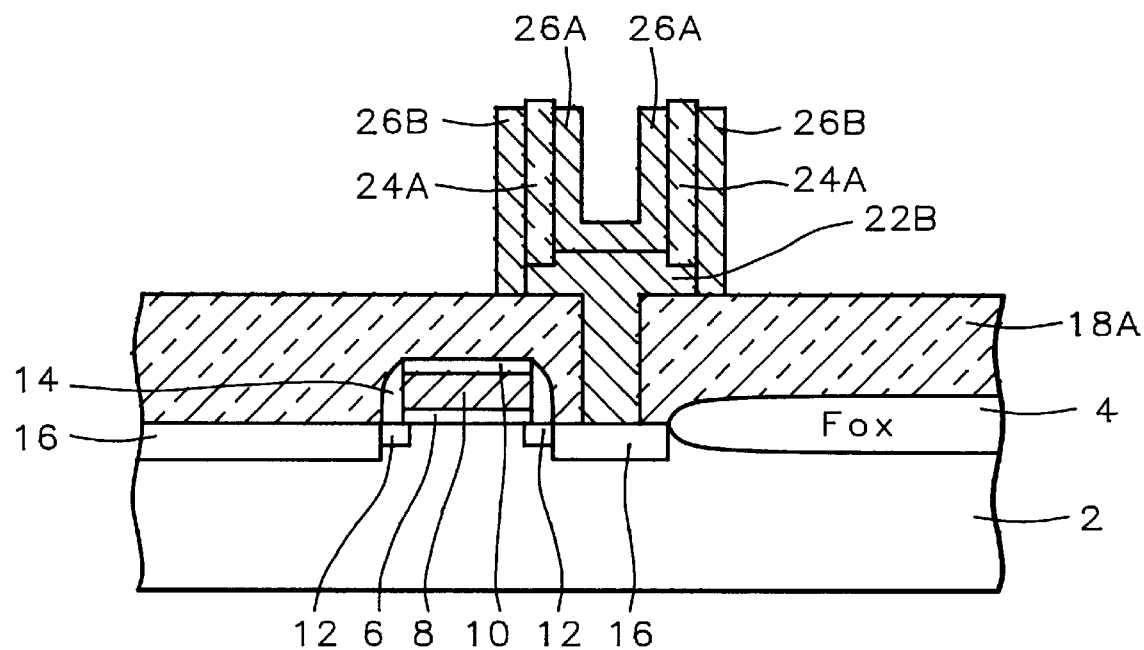

As shown in FIG. 8, the second conductive layer 26 is selectively etched forming inner and outer conductive walls 26A 26B on the sidewalls of the dielectric spacers 24A. This forms a bottom electrode 22B, 26A, 26B.

Figure 9:
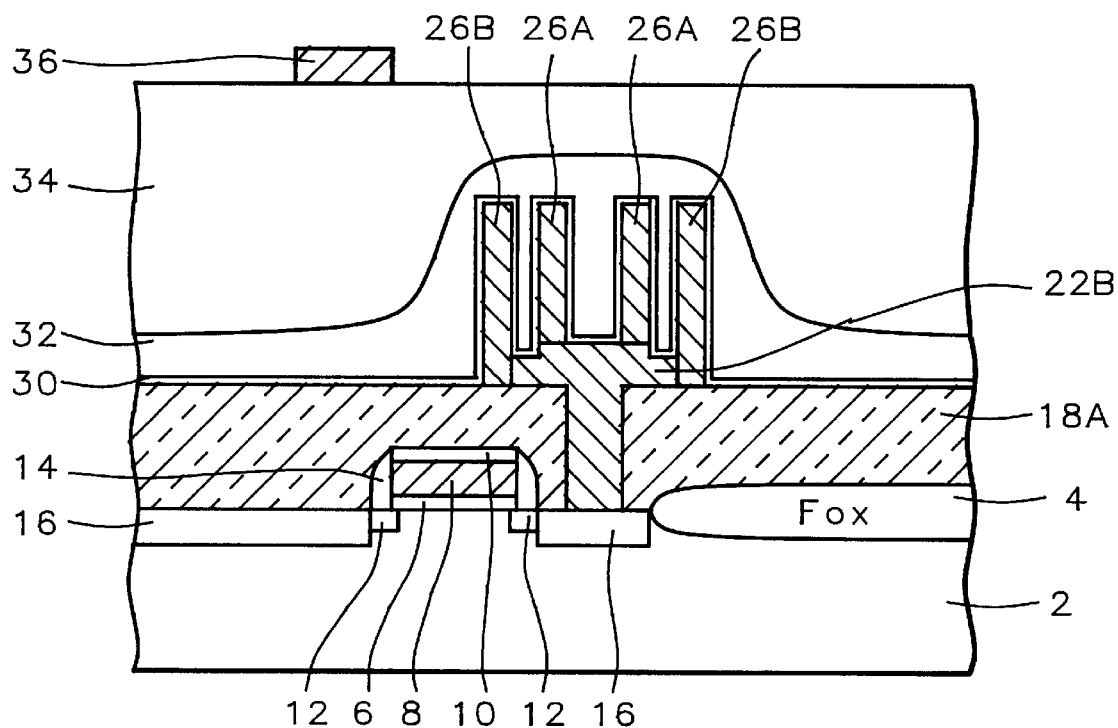

Referring to FIG. 9, the dielectric spacers 24A are removed preferably by a selective etch. Dielectric spacers 24A composed of nitride are preferably removed using a $H_3PO_4$ (phosphoric acid) solution.

As shown in FIG. 9, a capacitor dielectric layer 30 and a top electrode 32 are formed over the double walled storage node 22B 26A 26B and the insulating layer 18A thereby forming a double walled crown capacitor.

The capacitor dielectric layer is preferably composed of oxide/nitride/oxide (ONO), silicon nitride, $Ta_2O_5$, or silicon oxide. The capacitor dielectric layer 30 preferably has a thickness in the range between about 40 and 60 Å. The top plate electrode 32 is preferably formed of doped polysilicon and preferably has a thickness in the range between about 1000 to 2000 Å. The top plate electrode 32 preferably has an impurity concentration in the range between about 1E19 and 1E21 atoms/$cm^3$.

Still referring to FIG. 9, a top insulation layer 34 (e.g., a passivation layer) is then formed over the top plate electrode 32. The top insulation layer 34 is preferably formed of silicon nitride, silicon oxide, doped silicon oxide, and borophosphosilicate glass (BPSG), and is more preferably formed of silicon oxide. Metal layers 36 are formed over the top insulating layer and in vias in the top insulating layer to connect the devices in a circuit. Additional metal layers and passivation layers are formed over the top insulation layer to connect the other device elements to form memory cell arrays and other devices.

Figure 10:
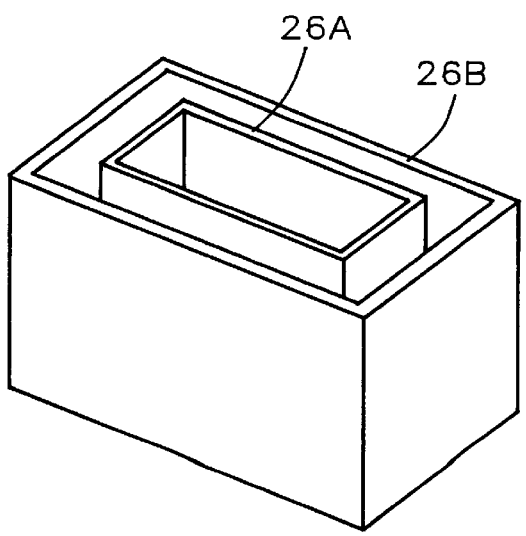
FIG. 10 shows a perspective view of the inner and outer conductive walls 26A 26B (cylinders) storage electrode of the capacitor of the present invention.

FIG. 10 shows a perspective view of a preferred embodiment of the double walled storage electrode 26A 2613 where the electrode has a rectangular shape. The electrode can have any desired shape and is not limited to a rectangular (box) shape.

The method of the current invention forms a cylindrical capacitor having a central spine which has a high surface area and capacitance. The invention uses only one photo mask to form the double walled cylindrical capacitor. The invention eliminates several expensive photo masks steps by using a sidewall dielectric spacer 24A and selective etch techniques. This reduces manufacturing costs and provides a simple process. The sidewall spacer techniques reduce the capacitor size and increase the capacitance.

While the invention has been particularly shown and described with reference to the preferred embodiments thereof, it will be understood by those skilled in the art that various changes in form and details may be made without departing from the spirit and scope of the invention.

What is claimed is:

1. A method of forming a double walled cylindrical capacitor on a substrate having source regions, drain regions and gate electrode structures comprising:

a) forming an insulating layer over a substrate surface;

b) forming a contact opening exposing said source region;

c) forming a first conductive layer over said insulating layer and filling said contact opening thereby forming an electrical contact with said source region;

d) patterning said first conductive layer forming a central spine over said contact opening, and leaving portions of said first conductive layer covering said insulating layer, said central spine having sidewalls;

e) forming a first dielectric layer over said portions of said first conductive layer and said central spine;

f) anisotropically etching said first dielectric layer forming dielectric spacers on said sidewalls of said central spine, and on said portions of said first conductive layer; said dielectric spacers having sidewalls;

g) anisotropically etching said portions of said first conductive layer over said insulating layer and etching back said central spine using said dielectric spacers as a mask forming a conductive base; said dielectric spacers on portions of said conductive base; said conductive base having sidewalls;

h) forming a second conductive layer over said insulating layer, said conductive base, and said dielectric spacers;

i) selectively etching said second conductive layer forming inner and outer conductive walls on the sidewalls of said dielectric spacers; said inner conductive wall on said conductive base and said outer conductive wall contacting said sidewalls of said conductive base thereby forming a bottom electrode having said conductive base electrically connecting said inner and outer conductive walls;

j) removing said dielectric spacers;

k) forming a capacitor dielectric layer and a top electrode over said bottom electrode and said insulating layer thereby forming a double walled cylindrical capacitor.

2. The method of claim 1 wherein said insulating layer is formed of silicon oxide, and has a thickness in a range between about 1000 and 2000 Å.

3. The method of claim 1 wherein said first conductive layer is formed of polysilicon and has a thickness in a range of between about 1000 and 2000 Å.

4. The method of claim 1 wherein said central spine has a shape selected from the group consisting of cylindrical and rectangular.

5. The method of claim 1 wherein said first dielectric layer is composed of silicon nitride and has a thickness in a range of between about 500 and 2000 Å.

6. The method of claim 1 wherein said second conductive layer is formed polysilicon and has a thickness in a range of between about 500 and 2000 Å.

7. The method of claim 1 which further includes forming a top insulating layer and a metal layer over said double walled cylindrical capacitor thereby forming a DRAM cell.

8. A method of forming a double walled cylindrical capacitor for a DRAM cell on a substrate having source regions, drain regions and gate electrode structures comprising:

a) forming an insulating layer composed of silicon oxide over a substrate surface;

b) forming a contact opening exposing said source region;

c) forming a first conductive layer composed of doped polysilicon over said insulating layer and filling said contact opening thereby forming an electrical contact with said source region;

d) patterning said first conductive layer forming a central spine over said contact opening, and leaving portions of said first conductive layer covering said insulating layer, said central spine having sidewalls;

e) forming a first dielectric layer composed of silicon nitride over said portions of said first conductive layer and said central spine;

f) anisotropically etching said first dielectric layer forming dielectric spacers on said sidewalls of said central spine, and on said portions of said first conductive layer; said dielectric spacers having sidewalls;

g) anisotropically etching said portions of said first conductive layer over said insulating layer and etching back said central spine using said dielectric spacers as a mask forming a conductive base; said dielectric spacers on portions of said conductive base; said conductive base having sidewalls;

h) forming a second conductive layer over said insulating layer, said conductive base, and said dielectric spacers;

i) selectively etching said second conductive layer forming inner and outer conductive walls on the sidewalls of said dielectric spacers; said inner conductive wall on said conductive base; said outer conductive wall contacting said sidewalls of said conductive base thereby forming a bottom electrode having said conductive base electrically connecting said inner and outer conductive walls;

j) removing said dielectric spacers;

k) forming a capacitor dielectric layer and a top electrode over said bottom electrode and said insulating layer thereby forming a double walled cylindrical capacitor.

9. The method of claim 8 wherein said insulating layer is has a thickness in a range between about 1000 and 2000 Å.

10. The method of claim 8 wherein said first conductive layer has a thickness in a range of between about 1000 and 2000 Å.

11. The method of claim 8 wherein said central spine has a shape selected from the group consisting of cylindrical and rectangular.

12. The method of claim 8 wherein said first dielectric layer is has a thickness in a range of between about 500 and 2000 Å.

13. The method of claim 8 wherein said second conductive layer has a thickness in a range of between about 500 and 2000 Å.

* * * * *